(12) United States Patent
Maeda et al.

(10) Patent No.: US 6,697,989 B1
(45) Date of Patent: Feb. 24, 2004

(54) METHOD AND APPARATUS FOR ERROR CORRECTION

(75) Inventors: Toshinori Maeda, Osaka (JP); Yukio Iijima, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 344 days.

(21) Appl. No.: 09/657,779

(22) Filed: Sep. 8, 2000

(30) Foreign Application Priority Data

Sep. 8, 1999 (JP) .......................................... 11-254656

(51) Int. Cl.⁷ ............................................. H03M 13/00
(52) U.S. Cl. ...................................................... 714/755
(58) Field of Search ................................. 714/755, 752, 714/758, 785

(56) References Cited

U.S. PATENT DOCUMENTS

| | | | |
|---|---|---|---|
| 4,998,253 A | | 3/1991 | Ohashi et al. |
| 5,438,577 A | * | 8/1995 | Nakase et al. ............... 714/785 |
| 5,563,896 A | * | 10/1996 | Nakaguchi ................... 714/785 |
| 5,570,378 A | * | 10/1996 | Inoue et al. ................. 714/785 |
| 5,574,735 A | * | 11/1996 | Takada et al. ............... 714/785 |
| 5,586,127 A | * | 12/1996 | Moriuchi ..................... 714/769 |
| 5,694,330 A | * | 12/1997 | Iwamura et al. ............ 714/761 |
| 5,847,840 A | * | 12/1998 | Enari ........................... 358/409 |
| 5,996,109 A | * | 11/1999 | Shikakura .................... 714/774 |
| 6,023,387 A | * | 2/2000 | Stenfort ....................... 360/53 |
| 6,052,815 A | * | 4/2000 | Zook ............................ 714/758 |
| 6,167,549 A | * | 12/2000 | Lin et al. ..................... 714/763 |
| 6,175,941 B1 | * | 1/2001 | Poeppelman et al. ....... 714/757 |
| 6,332,206 B1 | * | 12/2001 | Nakatsuji et al. ........... 714/755 |
| 6,427,219 B1 | * | 7/2002 | Yang ............................ 714/758 |
| 6,519,736 B1 | * | 2/2003 | Chen et al. .................. 714/768 |
| 6,539,513 B1 | * | 3/2003 | Chen ............................ 714/758 |
| 6,574,774 B1 | * | 6/2003 | Vasiliev ....................... 714/800 |

FOREIGN PATENT DOCUMENTS

| | | |
|---|---|---|
| JP | 62-329295 | 12/1987 |
| JP | 63-203014 | 8/1988 |
| JP | 8-130480 | 5/1996 |
| WO | 97/11530 | 3/1997 |

* cited by examiner

*Primary Examiner*—Albert Decady
*Assistant Examiner*—Matthew C. Dooley
(74) *Attorney, Agent, or Firm*—Wenderoth, Lind & Ponack, L.L.P.

(57) ABSTRACT

The present invention provides an error correction apparatus and an error correction method, which does not execute unnecessary syndrome operation and operation processing subsequent to the syndrome operation. A format interface 10a judges whether an uncorrectable error is included in parallel with demodulation of received data, and outputs an error correction incapability detection signal when the uncorrectable error is included. The error correction circuit 20a executes decoding of the error correction, including syndrome operation, for demodulated data from the format interface 10a, suspends the syndrome operation when the error correction incapability detection signal is input, and terminates the error correction.

28 Claims, 9 Drawing Sheets

METHOD AND APPARATUS FOR ERROR CORRECTION

FIELD OF THE INVENTION

The present invention relates to an error correction method using an apparatus for correcting errors in received information data and the error correction apparatus. More particularly, it relates to an error correction method and an error correction apparatus for correcting errors in information data to which error-correcting codes comprising a product code having inner codes and outer codes are added.

BACKGROUND OF THE INVENTION

Initially, a prior art error correction apparatus is described.

FIG. 9 is a block diagram illustrating a structure of the prior art error correction apparatus 50.

The error correction apparatus 50 has a format interface 10 for executing demodulation processing for serial data 100 from an optical disk playback apparatus 6 and outputting demodulated data, a buffer memory 32 containing the demodulated data, an error correction circuit 20 for executing decoding including syndrome operation for the error-correcting codes, using the demodulated data from the format interface 10 or buffer memory 32, a buffer memory manager 31 for controlling writing of the demodulated data onto the buffer memory 32 and reading of the demodulated data out of the buffer memory 32, a descrambling circuit 33 for executing descrambling processing for demodulated data 300 which are read out of the buffer memory 32, a data transfer circuit 34 for transferring data 301 from the descrambling circuit 33 after being subjected to the descrambling processing to an external apparatus as transfer data 302, and a microcontroller 40 for outputting control signals to the respective circuits in the error correction apparatus 50 to control the whole operation of the error correction apparatus 50.

The format interface 10 has a Sync code detection and removal circuit 11 for converting the received serial data 100 in parallel, to detect frame Sync codes, synchronizing the received data, and then removing the frame Sync codes, and a demodulation circuit 12 for executing the demodulation processing for information data 102 from the Sync code detection and removal circuit 11.

The error correction circuit 20 has a first syndrome operation circuit 21 for executing syndrome operation for the demodulated data 106 from the demodulation circuit 12, a second syndrome operation circuit 22 for executing syndrome operation for the demodulated data from the buffer memory 32, a syndrome selection circuit 23 for selecting the syndrome operation result of one of the first and second syndrome operation circuits 21 and 22 and outputting the selected result, a Eucledean algorithm operation circuit 24 for deriving an error location polynomial and an error value polynomial on the basis of the syndrome operation result 202 from the syndrome selection circuit 23, a chain search circuit 25 for calculating an error location from the degree of the error location polynomial, an error value operation circuit 26 for calculating an error value from the degree of the error value polynomial, an address generation circuit 27 for converting the calculated error location into a logical address 206 on the buffer memory 32, and an error correction circuit 28 for reading data 207 at the logical address 206 which is output by the address generation circuit 27 and executing error correction.

That is, the error correction apparatus 50 judges whether errors are included in the received data on the basis of the operation result of the syndrome operation which is executed for the demodulated data, and judges whether the errors included in the received data are correctable errors on the basis of the degree of the error location polynomial which is derived from the syndrome operation result. When the errors included in the received data are correctable, the error location and error value are respectively obtained from the derived error location polynomial and error value polynomial, thereby to correct the errors in the received data.

In addition, the error correction apparatus 50 is constructed so that the demodulation of the received data and the decoding of the demodulated data is executed in the same order as the order in which the received data are received. Here, the description is given assuming that the error correction of inner codes is initially executed.

Next, prior art error correction processing is described with reference to a flowchart of FIG. 8.

Initially in STEP 10, when the serial data 100 (referred to also as received data) are input to the error correction apparatus 50, synchronization of the received data is protected by the Sync code detection and removal circuit 11. Then, in parallel with the demodulation processing in the demodulation circuit 12, the syndrome operation is executed for the demodulated data 106 from the demodulation circuit 12 by the first syndrome operation circuit 21.

In STEP 13, it is judged whether a code length of data has been processed. When it is in the middle of the processing, the processing branches to LOOP 10 and the syndrome operation is continued. For example, in the case of the inner code of DVD as shown in FIG. 6, the code length of the received data is 182 bytes. When the processing for the code length of the data is completed, the processing proceeds to STEP 20.

In STEP 20, it is judged by the Eucledean algorithm operation circuit 24 whether there are errors in the received data on the basis of whether the result 200 of the syndrome operation from the first syndrome operation circuit 21 is zero. When the operation result 200 is zero, no error is included in the data and therefore the error correction processing is terminated.

When errors are included in the data, the processing proceeds to STEP 21. In STEP 21, the error value polynomial and the error location polynomial are derived by the Eucledean algorithm operation circuit 24.

In the following STEP 22, it is initially judged whether the errors included in the received data are capable of error correction on the basis of the degree of the error location polynomial (which indicates the number of the errors).

In the case of the inner code of DVD, 10 bytes of parity data are added and it has a 5-byte error correction capability. When this error correction capability is exceeded, the error correction is incapable. Therefore, the error correction processing of the inner codes is terminated.

When the errors included in the received data are capable of error correction, the processing proceeds to the following STEP 23. In STEP 23, the error location 204 is obtained from the coefficients of the error location polynomial by the chain search circuit 25. This error location 204 is converted into the logical address 206 on the buffer memory 32 by the address generation circuit 27 and stored in the buffer memory 32, and then the processing proceeds to STEP 24.

In STEP 24, the error value 205 is obtained from the coefficients of the error value polynomial by the error value operation circuit 26 as well as the logical address 206 of the error location, which is obtained in the previous STEP 23, is read out of the buffer memory 32. The error correction is executed for the read data 207 on the basis of the error value 205.

In the next STEP 25, when the degree of the error correction has been completed, the error correction processing of the inner codes is terminated. When it is in the middle of the error correction processing, the processing proceeds to LOOP 21 and the error correction for the remaining errors is continued.

Thus, in the prior art error correction method, the error location polynomial is obtained and the judgement as to whether errors included in the received data are capable of error correction can be made only on the basis of the degree of the obtained polynomial.

The erasure correction of the outer codes is executed when the degree of the error location polynomial derived by the Eucledean algorithm operation circuit 24 exceeds the error correction capability using the information of rows which were incapable of error correction, being obtained during the error correction of the inner codes.

Another error correction apparatus is disclosed in Japanese Published Application No. Hei. 8-130480. This "error correction decoder" judges whether there are errors and whether the errors are correctable using the result of the syndrome operation, and executes control as to whether the subsequent error correction processing is to be executed on the basis of the judgement result.

As described above, the prior art error correction apparatus uses the operation result of the syndrome operation or derives the error location polynomial and thereby uses the degree of the obtained polynomial to make the judgement as to whether the errors are capable of error correction. However, the method of judging whether the errors are capable of error correction on the basis of the operation result of the syndrome operation can be applied only to a code having a lower error correction capability. Accordingly, this method cannot be applied to codes of DVD or the like, having a higher error correction capability, to realize high-density recording. In addition, in the method of deriving the error location polynomial and make the judgement as to whether the errors are capable of error correction on the basis of the degree of the obtained polynomial, unnecessary processing of STEPs 21 and 22 following the syndrome operation is executed even when uncorrectable errors are included in the received data.

Further, in the prior art error correction apparatus, the erasure correction of the outer codes is executed using the information of rows which were incapable of the error correction, being obtained at the time when the inner code is decoded. However, the information of the rows which is obtained at the decoding time of the inner code has lower precision as the information for estimating the error location when the erasure correction of the outer codes is executed. Therefore, the error correction capability cannot be increased.

SUMMARY OF THE INVENTION

It is an object of the present invention to provide a method and apparatus for error correction having a good error correction capability, which can detect whether errors in the received data are correctable errors without deriving the error location polynomial also for a code having a higher error correction capability, and does not execute unnecessary syndrome operations and processing subsequent to the syndrome operation.

An error correction apparatus according to a first aspect of the present invention comprises: information data demodulation means for executing demodulation processing for information data to which error-correcting codes are added, to output demodulated data as well as detecting an uncorrectable error from the information data in parallel with the demodulation processing; and correction decoding means for executing decoding of error correction, including syndrome operation, for the demodulated data from the information data demodulation means as well as suspending the syndrome operation when the uncorrectable error is detected by the information data demodulation means. Therefore, unnecessary syndrome operation is not executed, whereby the power consumption can be reduced. Further, the hardware resources can be effectively utilized, thereby increasing the error correction performance.

According to a second aspect of the present invention, in the error correction apparatus of the first aspect, the information data to which the error-correcting codes are added comprise a product code having inner codes in a row direction and outer codes in a column direction, and the correction decoding means executes the error correction decoding for the demodulated data from the information data demodulation means in the same order as that of the demodulation in the information data demodulation means. Therefore, the error detection information at the demodulation time can be utilized for the erasure correction of the information data in a direction different from that of the demodulation.

According to a third aspect of the present invention, in the error correction apparatus of the first or second aspect, the information data demodulation means comprises: Sync code detection and removal means for receiving the information data, converting the received data in parallel, detecting a frame Sync code, synchronizing the received data, and then removing the frame Sync code, as well as counting a number of the received data in one SYNC frame; demodulation means for executing demodulation processing for the received data from the Sync code detection and removal means; a number-of-missing-data counter for counting a number of missing data in a predetermined code length of data on the basis of the number of the received data from the Sync code detection and removal means; an inhibition pattern detector/counter for detecting abnormal patterns which do not conform a predetermined modulation rule from the received data which are output from the Sync code detection and removal means, and counting a number of inhibition patterns; and error correction incapability judge means for judging whether an uncorrectable error is included in the information data on the basis of the number of missing data obtained by the number-of-missing-data counter and the number of inhibition patterns obtained by the inhibition pattern detector/counter, and outputting an error correction incapability detection signal when the uncorrectable error is included. Therefore, also for the codes having a higher error correction capability, the errors exceeding the correction capability can be detected from the received data without solving the error location polynomial. Accordingly, unnecessary syndrome operation can be omitted, whereby the power consumption can be reduced. Further, the hardware resources can be effectively utilized, thereby improving the error correction performance.

According to a fourth aspect of the present invention, in the error correction apparatus of one of the first through third aspects, storage means which contains demodulated data are provided, and the correction decoding means comprises: first syndrome operation means for executing syndrome operation for the demodulated data output from the demodulation means; second syndrome operation means for executing syndrome operation for the demodulated data output from the storage means; syndrome selection means for selecting one of syndrome operation results of the first and second syndrome operation means and outputting the selected syndrome operation result; error detection means for calculating an error location and an error value on the basis of the syndrome operation result output from the syndrome selection means; and correction means for correcting errors in the received information data on the basis of the error location and the error value. Therefore, unnecessary syndrome operation and the processing subsequent to the syndrome operation are not executed, thereby reducing the power consumption. Further, the hardware resources can be effectively utilized, whereby the error correction performance can be increased.

According to a fifth aspect of the present invention, in the error correction apparatus of the third aspect, when there is data missing in the information data, the means interpolates data of the missing on the number of the missing data, obtained by the number-of-missing-data counter, and makes the information have the predetermined code length. Therefore, even when there is data missing due to bit slip or the like, the received data always have a predetermined length. Accordingly, when data are stored in the buffer memory, the data can be written in a contiguous area.

According to a sixth aspect of the present invention, in the error correction apparatus of the third aspect, when there is data missing in the information data, the Sync code detection and removal means execute interpolation of the data missing using the inhibition patterns under the modulation rule, the inhibition pattern detector/counter detects the inhibition patterns in the information data for which the data missing is interpolated by the Sync code detection and removal means, and the error correction incapability judge means judges whether the error correction is possible, only on the basis of whether the number of inhibition patterns obtained by the inhibition pattern detector/counter exceeds error correction capability of the information data. Therefore, the number-of-missing-data counter is not required. Thus, the error correction incapability judge means detects uncorrectable errors only from the output of the inhibition pattern counter.

According to a seventh aspect of the present invention, in the error correction apparatus of the third aspect, erasure correction information storage means are provided, which when it is judged by the error correction incapability judge means that an uncorrectable error is included in the information data in the same direction as that of the demodulation, contain location information of correction incapability of the error judged to be uncorrectable, as first erasure correction information, and when the information is decoded in a direction different from that of the demodulation, the erasure correction information storage means judges whether erasure correction is possible from whether the number of error correction incapabilities in the information data in the same direction as that of the demodulation, as the number of erasures, exceeds erasure correction capability of the information data in the direction different from that of the demodulation, on the basis of the first erasure correction information which is stored in the means when the information data are decoded in a direction different from that of the demodulation, and controls the execution of the erasure correction on the basis of the judgement result. Therefore, unnecessary syndrome operation and the processing subsequent to the syndrome operation is not executed, whereby the power consumption can be reduced. Further, the hardware resources can be effectively utilized, thereby improving the error correction performance.

According to an eighth aspect of the present invention, in the error correction apparatus of the fourth or seventh aspect, the storage means contains the location information of the error correction incapability obtained when the error location is detected by the error detection means, as second erasure correction information, and the correction decoding means selects optimum erasure correction information from the first erasure correction information which is stored in the erasure correction information storage means and the second erasure correction information which is stored in the storage means when the erasure correction of the information data in the direction different from that of the demodulation is possible, and use the selected erasure correction information for the erasure correction. Therefore, information which has a narrower range and a higher precision than those of the conventional incapability information at the decoding can be utilized, whereby the error correction capability can be increased.

According to a ninth aspect of the present invention, in the error correction apparatus of the fourth aspect, the first syndrome operation means suspends the syndrome operation as well as nullify the syndrome operation result, when the error correction incapability detection signal is input by the error correction incapability judge means during the syndrome operation, and the error detection means does not execute the calculation of the error location and the error value when the syndrome operation result is zero. Therefore, unnecessary syndrome operation and processing subsequent to the syndrome operation are not executed, whereby the power consumption can be reduced. Further, the hardware resources can be effectively utilized, whereby the error correction performance can be increased.

According to a tenth aspect of the present invention, in the error correction apparatus of the fourth aspect, control means for controlling a series of operations of the syndrome operation, the calculation of the error location and the error value, and the error correction are provided, and the control means performs controls so as to execute none or part of the series of the operations of the syndrome operation, the calculation of the error location and the error value, and the error correction in the correction means, when the error correction incapability detection signal is input to the correction means by the error correction incapability judge means. Therefore, the unnecessary syndrome operation and the processing subsequent to the syndrome operation are not executed, whereby the power consumption can be reduced. Further, the hardware resources can be effectively utilized, thereby improving the error correction performance.

An error correction method according to an eleventh aspect of the present invention comprises: a counting step of, when demodulation processing is executed for information data to which error correcting-codes are added, detecting whether there are inhibition patterns which do not conform a modulation rule of the information data and there is data missing in a SYNC frame, and counting a number of the inhibition patterns and the missing data, respectively; a judging step of detecting errors which are incapable of error correction from the information data on the basis of the number of the missing data and the number of the inhibition patterns, and judging whether the detected errors are capable of the error correction, an error correction step of executing error correction processing, when the judgement result of the error correction indicates that the error correction is capable;

and a terminating step of terminating a series of the error correction processing, when the judgement result of the error correction indicates that the error correction is incapable or when the error correction is completed, and judging whether error correction of the information data is possible or not prior to the error correction processing, and controlling the error correction processing on the basis of the judgement result. Therefore, unnecessary syndrome operation and the processing subsequent to the syndrome operation are not executed, thereby reducing the power consumption. Further, the hardware resources can be effectively utilized, whereby the error correction performance can be improved.

According to a twelfth aspect of the present invention, the error correction method of the eleventh aspect comprises: a first storage step of, when it is judged in the judging step that the errors included in the information data are incapable of the error correction, storing location information of error correction incapability as first erasure correction information; a second storage step of storing location information of error correction incapability, which is obtained in the error correction step during the error correction, as second erasure correction information, and an erasure correction step of executing erasure correction of the information data in a direction different from that of the demodulation, using the first and second erasure correction information which is stored in the first and second storage steps. Therefore, the information which has a narrower range and a higher precision than those of the conventional correction incapability information at the decoding can be utilized, whereby the error correction performance can be increased.

DETAILED DESCRIPTION OF THE PREFERRED EMBODIMENTS

Embodiment 1

Figure 1:
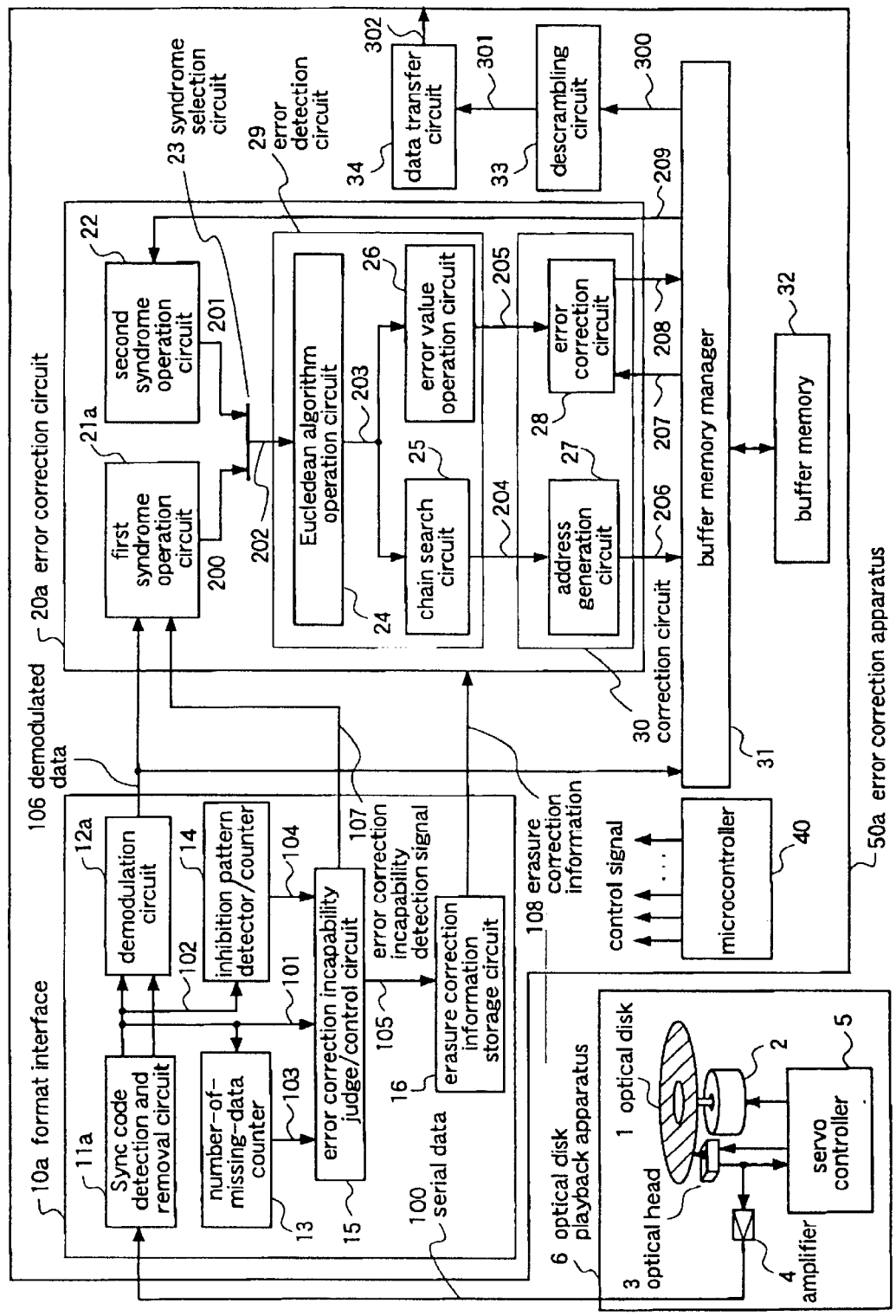
FIG. 1 is a block diagram illustrating a structure of an error correction apparatus 50a according to the present invention.

FIG. 1 is a block diagram illustrating a structure of an error correction apparatus 50a according to a first embodiment of the present invention.

Data input to the error correction apparatus 50a of the first embodiment are serial data 100 which are read by an optical disk playback apparatus 6.

The optical disk playback apparatus 6 comprises a spindle motor 2 for rotationally driving an optical disk 1 on which information is recorded, an optical head 3 for reading the information recorded on the optical disk 1, an amplifier 4 for amplifying the information read by the optical head 3, and a servo controller 5 for receiving the information read by the optical head 3 and outputting servo control signals to the spindle motor 2 and the optical head 3. The information which is read from the optical disk 1 by the optical head 3 is amplified by the amplifier 4 and output as the serial data 100 which are referred to as channel bits to the error correction apparatus 50a.

To the serial data 100, error-correcting codes are added. Information data to which the error-correcting codes are added is composed of product codes having inner codes in the row direction and outer codes in the column direction.

Figure 5:
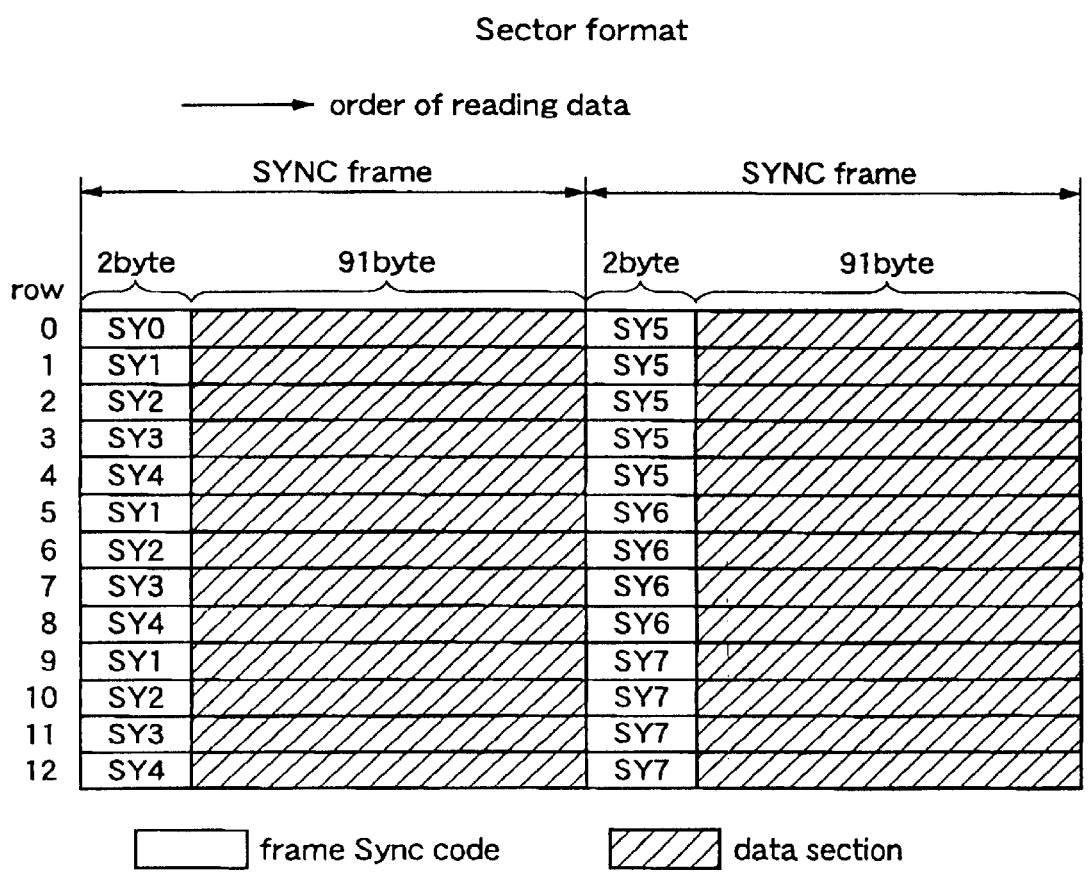
FIG. 5 is a diagram illustrating a structure of one sector format of DVD, taking a product code as an example.
Figure 6:
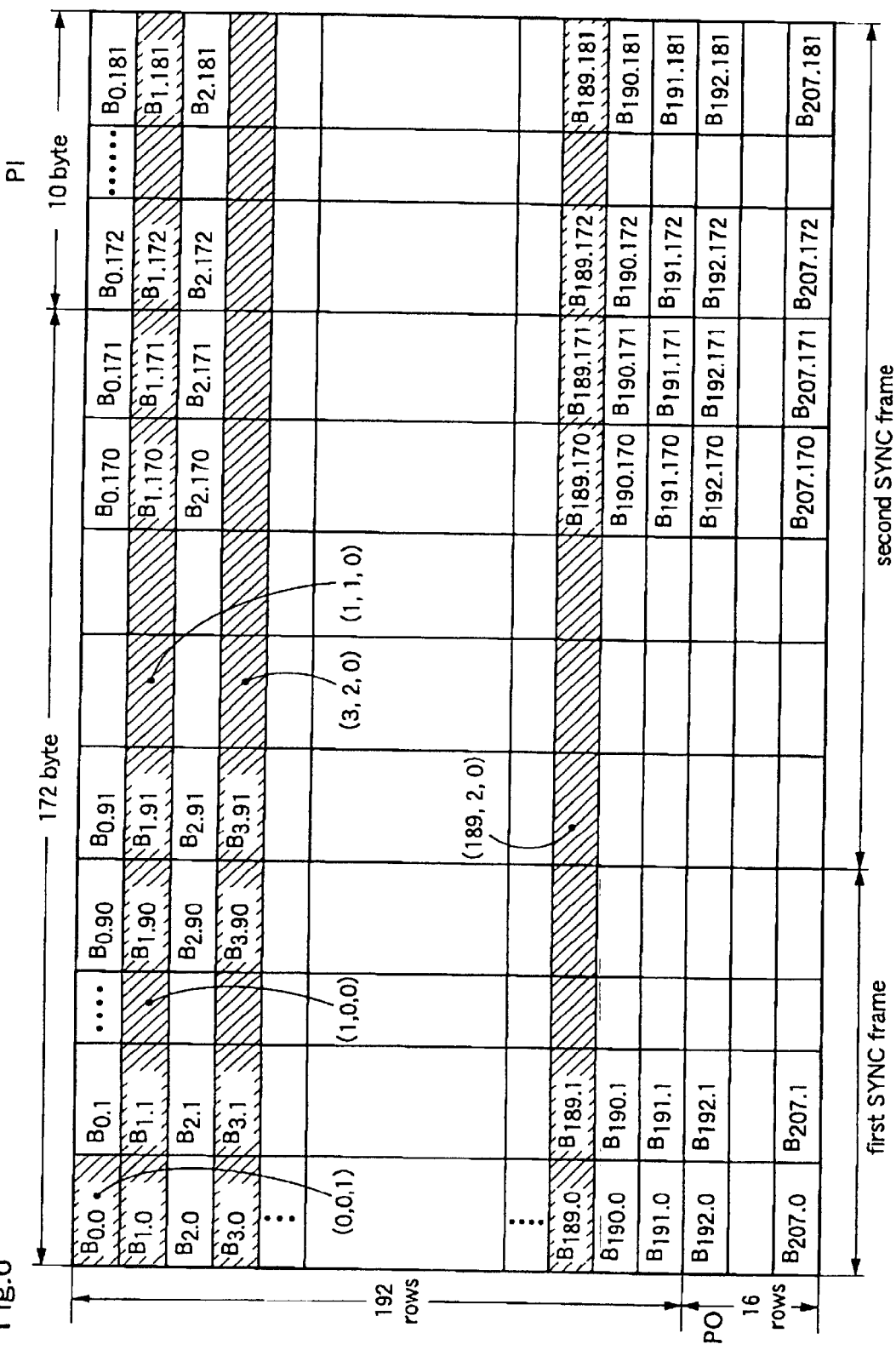
FIG. 6 is a diagram illustrating a data structure one ECC block of DVD, taking the product code as an example.

When the information is recorded on the optical disk 1 pursuant to the DVD format, data of one sector including frame Sync codes have the structure as shown in FIG. 5. one ECC (error-correcting code) block as unit for the error correction, which is composed of 16 sectors, is shown in FIG. 6.

As shown in FIG. 5, one SYNC frame is composed of 91 byte of data and 2 byte of a frame Sync code (SY0 to SY7 in this figure) which is added every 91-byte data. One sector is composed of 13 rows each being composed of two SYNC frames.

As shown in FIG. 6, one ECC block is composed of 16 sectors. Codes which are arranged in the row direction are referred to as inner codes. Codes which are arranged in the column direction are referred to as outer codes. The inner code and outer code have structures of RS (182, 172, 11) and RS (208, 192, 17), respectively. The received data are read in the row direction. In the error correction apparatus 50a of the first embodiment, demodulation of the received data and decoding of the demodulated data is executed in the same order as the order in which the received data are received. Here, the description is given assuming that the error correction of the inner codes is initially executed.

The error correction apparatus 50a of the first embodiment has a format interface 10a (information data demodulation means) for executing the demodulation processing for the serial data 100 frog the optical disk playback apparatus to output demodulated data as well as detecting uncorrectable errors from the serial data 100 in parallel with the demodulation processing, in place of the format interface 10 of the prior art error correction apparatus 50, and an error correction circuit 20a (correction decoding means) for executing decoding of the error correction, including syndrome operation, for the demodulated data 106 from the format interface 10a as well as suspending the syndrome operation when an uncorrectable error is detected by the format interface 10a, in place of the prior art error correction circuit 20. Other construction is same as that of the prior art error correction apparatus 50. The error correction apparatus 50a is further provided with a buffer memory 32 (storage means) containing the demodulated data, a buffer memory manager 31 for controlling writing of the demodulated data onto the buffer memory 32 and reading of the demodulated data from the buffer memory 32, a descrambling circuit 33 for executing descrambling processing for demodulated data 300 which are read from the buffer memory 32, a data transfer circuit 34 for transferring data 301 after the descrambling processing which are output from the descrambling circuit 33 to an external device as transfer data 302, and a microcontroller 40 (control means) for outputting control signals to the respective circuits in the error correction apparatus 50a to control the whole operation of the error correction apparatus 50a.

The format interface 10a in the error correction apparatus 50a has a Sync code detection and removal circuit 11a (Sync code detection and removal means) for converting the received serial data 100 in parallel with detect the frame Sync codes, synchronizing the received data and then removing the frame Sync codes, as well as counting the number 101 of the received data in the one SYNC frame, in place of the Sync code detection and removal circuit 11 of the prior art format interface 10, and a demodulation circuit 12a (demodulation means) for executing the demodulation processing for information data 102 from the Sync code detection and removal circuit 11 a as well as interpolating missing data in the inner code in the same direction as that of the demodulation, in place of the demodulation circuit 12 of the prior art format interface 10. The format interface 10a in the error correction apparatus 50a of the present invention further has a counter (hereinafter referred to as a number-of-missing-data counter) 13 for counting the number 103 of missing data in 182-byte inner code length of data on the basis of the number 101 of the received data from the Sync code detection and removal circuit 11a an inhibition pattern detector/counter 14 for detecting abnormal patterns which do not conform to 8–16 modulation rule from the inner codes of the information data 102 from the Sync code detection and removal circuit 11a and counting the number 104 of inhibition patterns, an error correction incapability judge/control circuit 15 (error correction incapability judge means) for judging whether uncorrectable errors are included in the received data on the basis of the number 103 of missing data which is output from the number-of-missing-data counter 13 and the number 104 of inhibition patterns which is output from the inhibition pattern detector/counter 14 and outputting an error correction incapability detection signal 107 when the uncorrectable error is included, and an erasure correction information storage circuit 16 (erasure correction information storage means) containing information 105 of the location of the uncorrectable inhibition pattern or missing data as first erasure correction information when the error correction incapability judge/control circuit 15 judges that the error is uncorrectable, in addition to the prior art format interface 10, thereby to judge whether uncorrectable errors are included in the received data, in parallel with the demodulation processing for the received data.

The demodulation circuit 12a interpolates the missing data at the end of the SYNC frame, when there is data missing in the inner code of the received data in the same direction as that of the demodulation, to be specific, when one SYNC frame of data is less than 91 bytes. When the number 103 of the missing data output from the number-of-missing-data counter 13 or the number 104 of the inhibition patterns output from the inhibition pattern detector/counter 14 exceeds the errors correction capability of the received data, the error correction incapability judge/control circuit 15 judges error correction incapability and outputs the error correction incapability detection signal 107.

When decoding the outer code of the information data in a direction different from that of the demodulation, the erasure correction information storage circuit 16 judges whether the erasure correction is capable on the basis of whether the number of erasures in the first erasure correction information stored in the erasure correction information storage circuit 16, i.e., the number of the uncorrectable inner codes in the received data exceeds the erasure correction capability of the outer codes of the received data, and controls execution of the erasure correction on the basis of the judgement result.

The error correction circuit 20a has a first syndrome operation circuit 21a (first syndrome operation means) for executing the syndrome operation for the demodulated data 106 from the demodulation circuit 12a, and suspending the syndrome operation and nullifying the operation result when the error correction incapability detection signal 107 is input, in place of the first syndrome operation circuit 21 of the prior art error correction circuit 20. When an uncorrectable error is detected, the error correction circuit 20a suspends the syndrome operation when the uncorrectable error is detected and does not derive the error location polynomial and the error value polynomial subsequent to the syndrome operation, thereby not executing unnecessary operations.

When the erasure correction of the outer code is executed, the error correction circuit 20a receives first erasure correction information which is obtained at the demodulation time and second erasure correction information which is obtained at the decoding of the inner code, and executes the erasure correction utilizing optimal erasure correction information selected from the received erasure correction information.

Other construction is the same as that of the prior error correction circuit 20. To be specific, the error erasure circuit 20a is provided with a second syndrome operation circuit 22 (second syndrome operation means) for executing the syndrome operation for demodulated data 209 from the buffer memory 32, a syndrome selection circuit 23 (syndrome selection means) for selecting the syndrome operation result of one of the first and second syndrome operation circuits 21a and 22 and outputting the selected syndrome operation result, an error detection circuit 20 (error detection means) for deriving the error location polynomial and the error value polynomial on the basis of the syndrome operation result and calculating the error location and the error value from the respective coefficients of the polynomials, and a correction circuit 30 (correction means) for correcting errors in the received data on the basis of the error location and the error value.

The error detection circuit 29 has a Eucledean algorithm operation circuit 24 for deriving the error location polynomial and error value polynomial from the operation result of the first or second syndrome operation circuit, a chain search circuit 25 for calculating the error location from the coefficients of the error location polynomial, and an error value operation circuit 26 for calculating the error value from the coefficients of the error value polynomial. The correction circuit 30 has an address generation circuit 27 for converting the error location calculated by the chain search circuit 25 into a logical address 206 on the buffer memory 32, and an error correction circuit 28 for reading data 207 at the logical address 206 which is output by the address generation circuit 27 from the buffer memory 32 and executing the error correction.

Here, the Eucledean algorithm operation circuit 24 judges whether the operation processing subsequent to the syndrome operation is to be executed on the basis of whether the input syndrome operation result is zero. When the syndrome operation result is zero, no error is included, or uncorrectable errors are included in the received data and accordingly the result is forcefully nullified. Therefore, the error correction of the inner code is terminated. When the syndrome operation result is not zero, the error location polynomial and the error value polynomial are derived. Further, the Eucledean algorithm operation circuit 24 judges whether the error included in the received data is correctable on the basis of the degree of the derived error location polynomial. When the error is correctable, the respective coefficients 203 of the error location polynomial and error value polynomial are output to the chain search circuit 25 and the error value operation circuit 26, respectively. When the error correction capability is exceeded, the error correction of the inner codes is terminated as well as the information of rows is output to the buffer memory 32 as the second erasure correction information.

The syndrome selection circuit 23 selects the operation result 200 of the first syndrome operation circuit 21a when the error correction for the demodulated data 106 from the demodulation circuit 12a is executed, and selects the operation result 201 of the second syndrome operation circuit 22 when the second or subsequent error correction for the demodulated data 209 stored in the buffer memory 32 is executed.

Next, the error correction of the DVD inner code by the error correction apparatus 50a of the present invention is described with reference to the flowchart of FIG. 4 and FIGS. 2 and 3.

Figure 2:
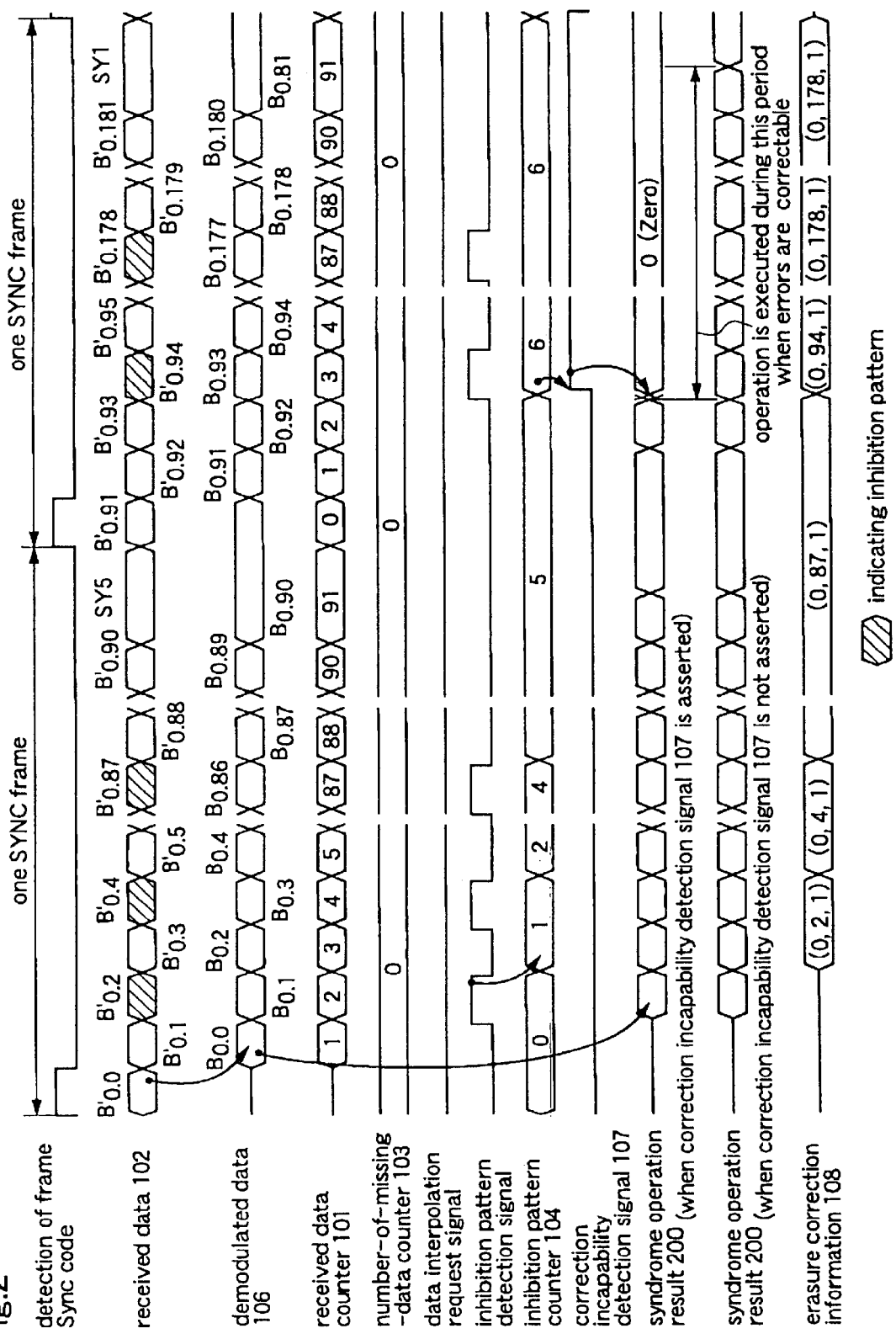
FIG. 2 is a timing chart showing the operation of error correction by the error correction apparatus 50a of the present invention when the number of inhibition patterns of a DVD inner code exceeds the error correction capability.
Figure 3:
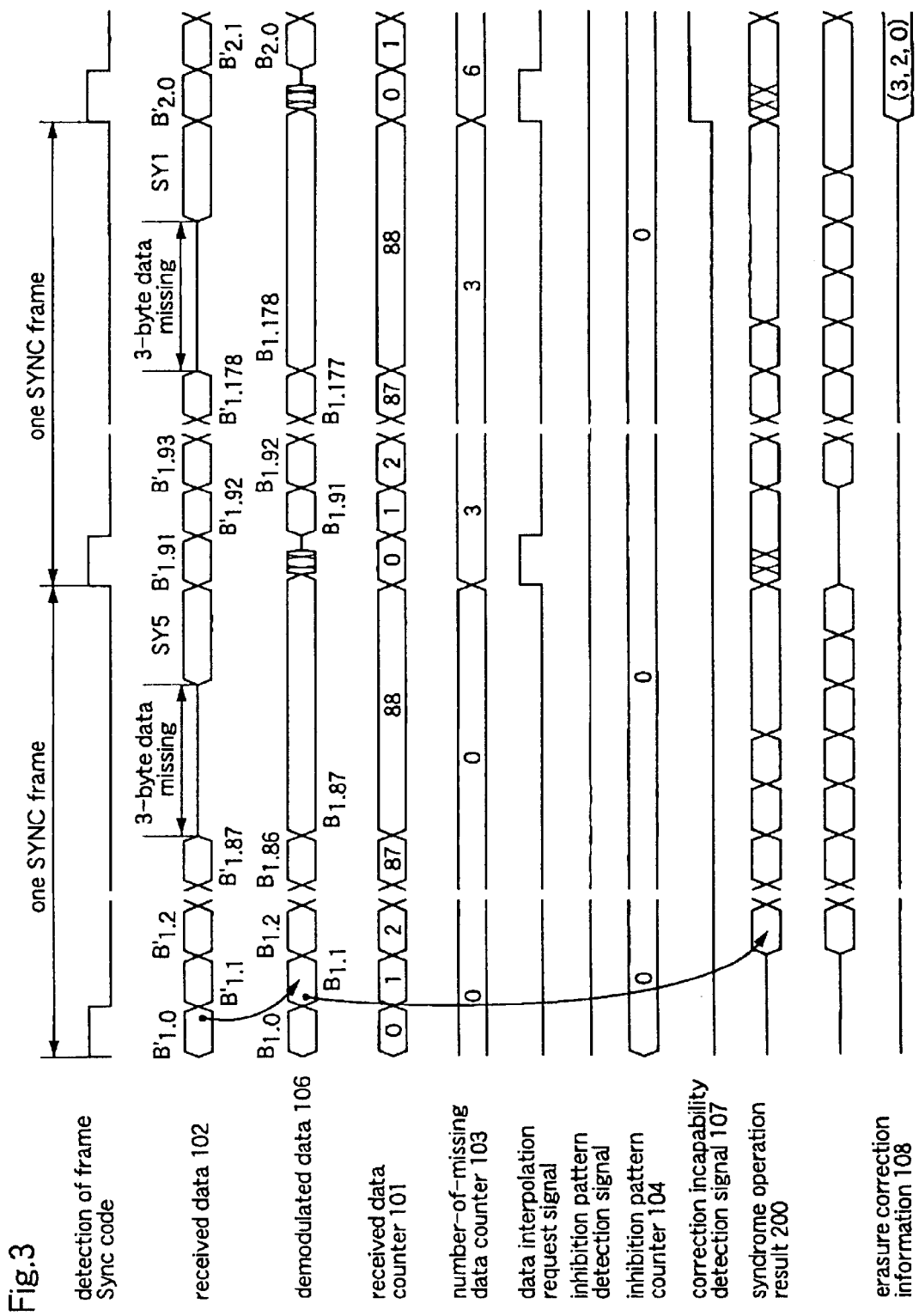
FIG. 3 is a timing chart showing the operation of the error correction by the error correction apparatus 50a of the present invention when the number of missing data of the DVD inner code exceeds the error correction capability.

FIGS. 2 and 3 are timing charts showing the operation of the DVD inner code error correction according to the present invention. In FIG. 2, the number of the inhibition patterns exceeds the error correction capability of the inner code. In FIG. 3, the number of the missing data exceeds the error correction capability of the inner code.

Figure 4:
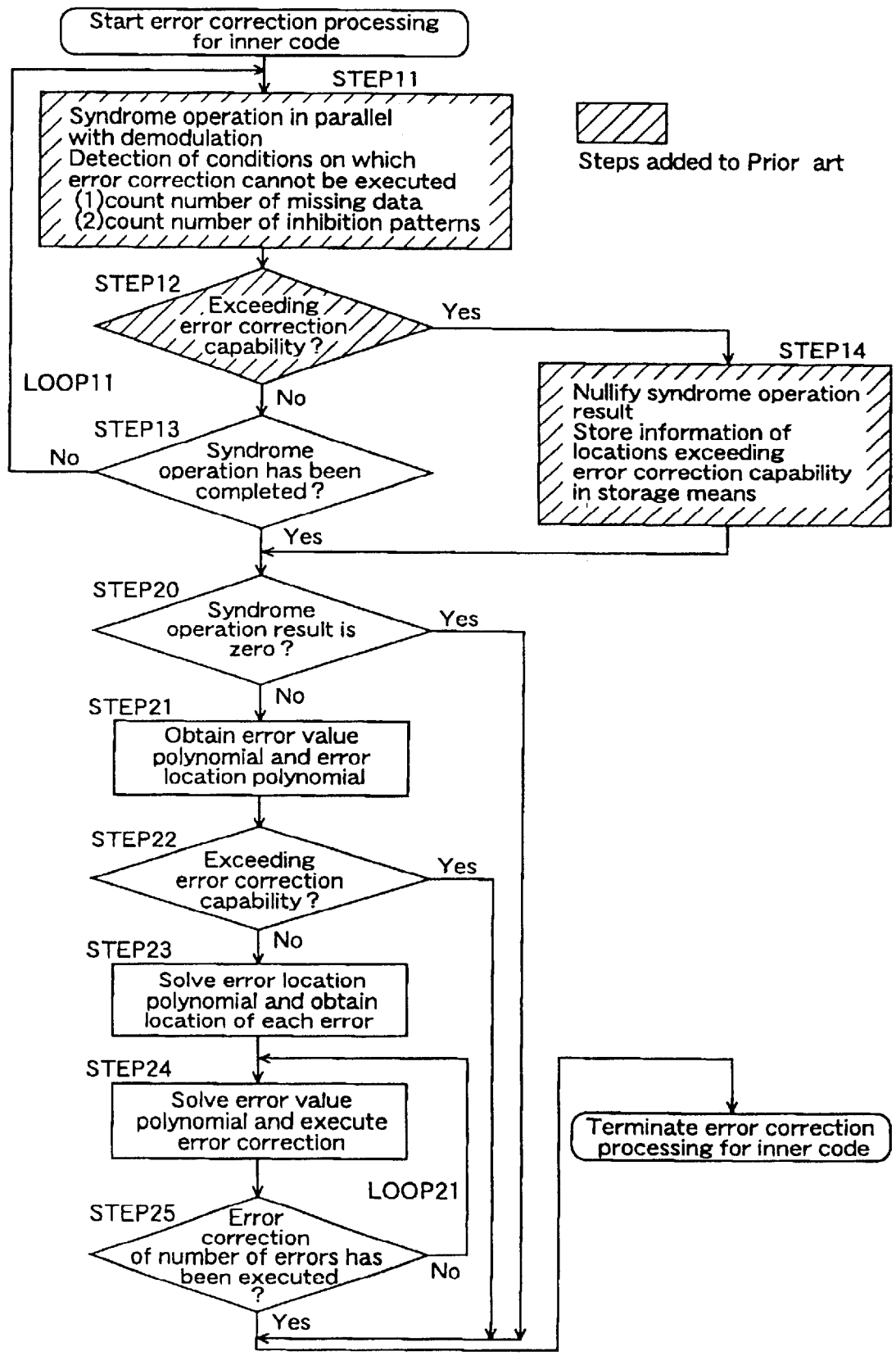
FIG. 4 is a flowchart for explaining the error correction processing for the DVD inner code by the error correction apparatus 50a of the present invention.

Initially, as illustrated in FIG. 4 in STEP 11, when serial data 100 are input to the error correction apparatus 50a from the optical disk playback apparatus 6, the synchronization of the serial data 100 is protected by the Sync code detection and removal circuit 11a, and then demodulation processing of the data is executed by the demodulation circuit 12a in accordance with the modulation rule (8–16 demodulation). In parallel with this demodulation processing, the syndrome operation for the demodulated data 106 from the demodulation circuit 12a is executed in the first syndrome as operation circuit 21a. Specifically, in the Sync code detection and removal circuit 11a, the input serial data 100 are parallelly converted and the frame Sync code is detected. The synchronization of the received data is protected in accordance with the detected frame Sync code and then the frame Sync code is removed. Then, the data are output to the demodulation circuit 12a and the inhibition pattern detector/counter 14, and the number of received data in one SYNC frame is counted and output to the demodulation circuit 12a and the number-of-missing-data counter 13.

In parallel with the demodulation processing, it is judged by the inhibition pattern detector/counter 14 whether there are abnormal patterns which do not conform with the 8–16 modulation rule from the information data 102 from the Sync code detection and removal circuit 11a. When there is the inhibition pattern, the inhibition pattern detection signal is asserted and the value 104 of the inhibition pattern counter is updated. This counted number 104 of the inhibition patterns in the inner code is output to the error correction incapability judge/control circuit 15.

In parallel with the demodulation processing, the number-of-missing-data counter 13 counts the number of bytes of data which are missing in the number 101 of the received data which are output by the Sync code detection and removal circuit 11a for each SYNC frame, as compared with the 182-byte inner code length of data. The counted number of the missing data of the inner code, i.e., the number 103 of data to be interpolated is output to the demodulation circuit 12a and the error correction incapability judge/control circuit 15. In the demodulation circuit 12a, data are added to the demodulated data 106 by the number of missing data, and the demodulated data 106 are output to the first syndrome operation circuit 21a and the buffer memory 32 via the buffer memory manager 31.

Here, the buffer memory manager 31 arbitrates access requests to the buffer memory 32 from plural bus masters, such as the format interface 10a, the error correction circuit 20a, and the descrambling circuit 33, and executes the control of writing/reading onto/from the buffer memory 32.

Next in STEP 12, it is judged by the error correction incapability judge/control circuit 15 whether uncorrectable errors are included in the information data 102 on the basis of the number 103 of missing data from the number-of-missing-data counter 13 and the number 104 of inhibition patterns from the inhibition pattern detector/counter 14. As the information for judging the error correction incapability, there are two kinds of information, i.e., information on the basis of the number of inhibition patterns and information on the basis of the number of missing data. The judging criteria are selected in accordance with a 2-bit control signal which is output by the microcontroller 40 as shown in Table 1.

| Control signal | Error correction incapability judging criteria |
|---|---|
| 00 | Judge only by the number of inhibition patterns |
| 01 | Judge only by the number of missing data |
| 10 | Judge by OR of the number of inhibition patterns and the number of missing data |
| 11 | Judge by AND of the number of inhibition patterns and the number of missing data |

In either of FIG. 2 or 3, it is not detected that the errors exceeding the error correction capability are included in the first SYNC frame of the inner code. However, in both of FIGS. 2 and 3, it is detected that an uncorrectable error is included in the second SYNC frame. When no uncorrectable error is included, the processing proceeds to STEP 13. When the uncorrectable error is included, the error correction incapability detection signal 107 is output from the error correction incapability judge/control circuit 15 to the first syndrome operation circuit 21a and the processing proceeds to STEP 14.

In STEP 13, it is judged whether the operation for 182 byte data of the inner code has been terminated. When it is in the middle of the operation, the processing branches to LOOP 11. When the operation has been terminated, the processing proceeds to STEP 20.

In STEP 14, when it is judged by the error correction incapability judge/control circuit 15 that the uncorrectable error is included in the received data 102, the location information 105 of the inhibition pattern or missing data exceeding the correction capability is stored in the erasure correction information storage circuit 16 as the first erasure correction information. In the first syndrome operation circuit 21a, the syndrome operation processing is suspended and the syndrome operation result is forcefully nullified so as not to execute the operation processing subsequent to the syndrome operation, and then processing proceeds to STEP 20.

In this way, it is always judged whether the errors are incapable of being corrected in parallel with the syndrome operation. Therefore, even when the syndrome operation for the 182-byte data of the inner codes is not terminated, the operation can be suspended at the timing when the uncorrectable error is detected and unnecessary syndrome operations can be stopped. Here, FIG. 2 shows the case where the operation is suspended in the middle of the code length and FIG. 3 shows the case where the error correction incapability is detected at the same time as the termination of the syndrome operation.

In STEP 20, it is judged by the Eucledean algorithm operation circuit 24 whether error correction is to be executed, on the basis of the syndrome operation result 200 from the first syndrome operation circuit 21a, to be specific, whether the syndrome operation result 200 is zero. When the syndrome operation result 200 is zero, no error is included or the operation result is forcefully nullified due to the error correction incapability in STEP 14. Therefore, the error correction processing of the inner code is terminated.

When the syndrome operation result is not zero, the processing proceeds to STEP 21. In STEP 21, the error location polynomial and the error value polynomial are derived from the operation result 200 of the first syndrome operation circuit 21a by the Eucledean algorithm operation circuit 24.

In the next STEP 22, whether uncorrectable errors are included is judged from the degree of the error location polynomial obtained by the Eucledean algorithm operation circuit 24 in STEP 21. When the received data include 6 bytes of errors or more, it is judged that the data include uncorrectable errors and then the error correction processing of the inner code is terminated. At this time, information of rows of the inner codes to which the error correction has been executed is output to the buffer memory 32 and stored in a special area in the buffer memory 32 as the second erasure correction information.

When the errors are less than 6 bytes, the processing proceeds to STEP 23. In STEP 23, the error location 204 is obtained by the chain search circuit 25 from the coefficients of the error location polynomial. This obtained error location 204 is converted by the address generation circuit 27 into the logical address 206 on the buffer memory 32 and this logical address 206 is stored in the buffer memory 32.

In the following STEP 24, the error value 205 is obtained by the error value operation circuit 26 from the coefficients of the error value polynomial. The data 207 at the logical address 206 which is output by the address generation circuit 27 are corrected by the error correction circuit 28 on the basis of the obtained error value 205. The data 208 which have been subjected to the error correction are written on the buffer memory 32.

In STEP 25, it is judged whether the error correction for the number of errors has been completed. When all the error correction has been completed, the error correction processing of the inner code is terminated. When all the error correction has not been completed, the processing branches to LOOP 21 and the error correction processing is continued.

Thus, in the error correction apparatus 50a, the first syndrome operation circuit 21a forcefully nullifies the operation result when the error correction incapability detection signal 107 is asserted. Therefore, the Eucledean algorithm operation circuit 24 does not derive the error location polynomial and the error value polynomial for the received data which are incapable of error correction, whereby the power consumption can be reduced as well as the processing for the operation result 201 of the second syndrome operation circuit 22 can be executed. Therefore, the hardware resources can be effectively utilized and the error correction performance is improved.

Next, the operation of the error correction apparatus 50a subsequent to the error correction of the inner codes is described.

When the error correction of the outer code following the inner code in the product code, or the second or subsequent error correction of the inner code is executed, the demodulated data 209 stored in the buffer memory 32 are read out via the buffer memory manager 31 and input to the second syndrome operation circuit 22. In the second syndrome operation circuit 22, the syndrome operation is executed for the input demodulated data 209 and the syndrome operation result 201 is input to the Eucledean algorithm operation circuit 24 via the syndrome selection circuit 23. Thereafter, the same processing as the error correction of the inner code is executed and the data 208 which have been subjected to the error correction are written in the buffer memory 32.

Particularly when the error correction of the outer code is executed, whether the erasure correction is capable is judged by the erasure correction information storage circuit 16 on the basis of whether the first erasure correction information 108 stored in the erasure correction information storage circuit 16 exceeds the erasure correction capability of the outer code. When the erasure correction is capable, the error correction processing of the outer code including the erasure correction of the outer code is executed.

When the erasure correction is capable, in the error correction circuit 20a, the demodulated data 209 stored in the buffer memory 32 are input, and the syndrome operation and a series of the error correction processing subsequent to the syndrome operation is executed, as well as the first erasure correction information 108 from the erasure correction information storage circuit 16 and the second erasure correction information from the butter memory 32 is input, then erasure correction information which is optimum for estimating the error location is selected among the input first and second erasure correction information, and the erasure correction of the outer code is executed with using the selected erasure correction information.

Data 300 whose error correction is completed are read from the buffer memory 32 and input to the descrambling circuit 33 via the buffer memory manager 31. In the descrambling circuit 33, the descrambling processing is executed for the input data 300 and data 301 which have been subjected to the descrambling are output to the data transfer circuit 34.

The input data 301 are output by the data transfer circuit 34 to the external device as the transfer data 302.

The control for the above-mentioned whole operation of the error correction apparatus 50a is executed in accordance with control signals output by the microcontroller 40.

As described above, according to the error correction apparatus of the first embodiment, whether uncorrectable errors are included is judged in parallel with the demodulation of the received data. When the uncorrectable error is detected, the syndrome operation is suspended and unnecessary syndrome operations are not executed, whereby the power consumption can be reduced. In the case of the error correction incapability, the processing subsequent to the syndrome operation is not executed, whereby the power consumption can be reduced, as well as the hardware resources such as the Eucledean algorithm operation circuit 24 can be effectively utilized. Therefore, the error correction performance can be improved.

In addition, according to the error correction apparatus of the first embodiment, it can be detected that the received data have the correction capability without solving the error correction polynomials, also for the code having a high error correction capability. Therefore, the unnecessary syndrome operations can be omitted, whereby the power consumption can be reduced.

Further, according to the error correction apparatus of the first embodiment, when there is data missing in the inner code of the received data, data of missing parts are interpolated to make the received data have a predetermined inner code length. Therefore, even when there is data missing due to bit slip or the like, the received data always have the predetermined inner code length. Thus, data can be written in contiguous regions at a time when the data are stored in the buffer memory 32.

In this first embodiment, the error correction apparatus which is provided with the first syndrome operation circuit 21a and the second syndrome operation circuit 22 so as to execute the syndrome operation in parallel with the demodulation is shown as an error correction apparatus having a high error correction performance. However, it is also possible that the demodulated data stored in the buffer memory 32 are read to execute the operation for the inner code using only the second syndrome operation circuit 22. Even with this circuit structure, when the information as to whether the error correction capability is exceeded is retained and the error correction processing is controlled by this information, it is not required to execute unnecessary syndrome operations and processing subsequent to the syndrome operation.

When the modulation is not variable-length transformation, the interpolation of the missing data is executed by the Sync code detection and removal circuit 11a and interpolated data are all decided to be inhibition patterns. Then, the detection of the inhibition patterns is executed for the interpolated received data. Accordingly, the number-of-imissing-data counter 13 is dispensed with and the error correction incapability judge/control circuit 15 can make the judgement as to whether the uncorrectable errors are included, only by the output of the inhibition pattern detector/counter 14.

Further, in place of the criterion of judging whether uncorrectable errors are included in the received data, other judgement criteria, for example, whether there are missing data or inhibition patterns in the received data, or whether the number of missing data or inhibition patterns exceeds some threshold such as a data transfer unit thought it is within the error correction capable range, can be utilized. When these judgement criteria are employed, the precision in estimation of the error location is more or less decreased. However, it is possible that unnecessary syndrome operation is not executed with suppressing the increase in the circuit scale and thereby the same functions as those of the first embodiment can be realized.

Further, in the error correction processing of the outer code, the judgement as to whether the erasure correction capability is exceeded can be made by the microcontroller 40 in place of the erasure correction information storage circuit 16. Also in this case, when the first erasure correction information is stored in the buffer memory 32 as the second erasure correction information, the same functions as those in the above-mentioned first embodiment can be realized without using the erasure correction information storage circuit 16. That is, the operation processing is continued as in the prior art without suspending the syndrome operation or the operation processing subsequent to the syndrome operation with only obtaining the first erasure correction information and storing the information in the buffer memory 32, whereby the control of the error correction circuit 20a can be facilitated.

Then, the interpolation of the missing data is executed by the format interface 10a so as to transfer data of contiguous regions. However, it is also possible that address management for data regions which are made discontinuous by the missing data is executed by a data transfer circuit such as DMA (Direct Memory Access). In this case, the number of data which are supplied to the first syndrome operation circuit 21a is reduced, whereby the operation result or operation halfway result should be compensated.

Embodiment 2

Figure 7:
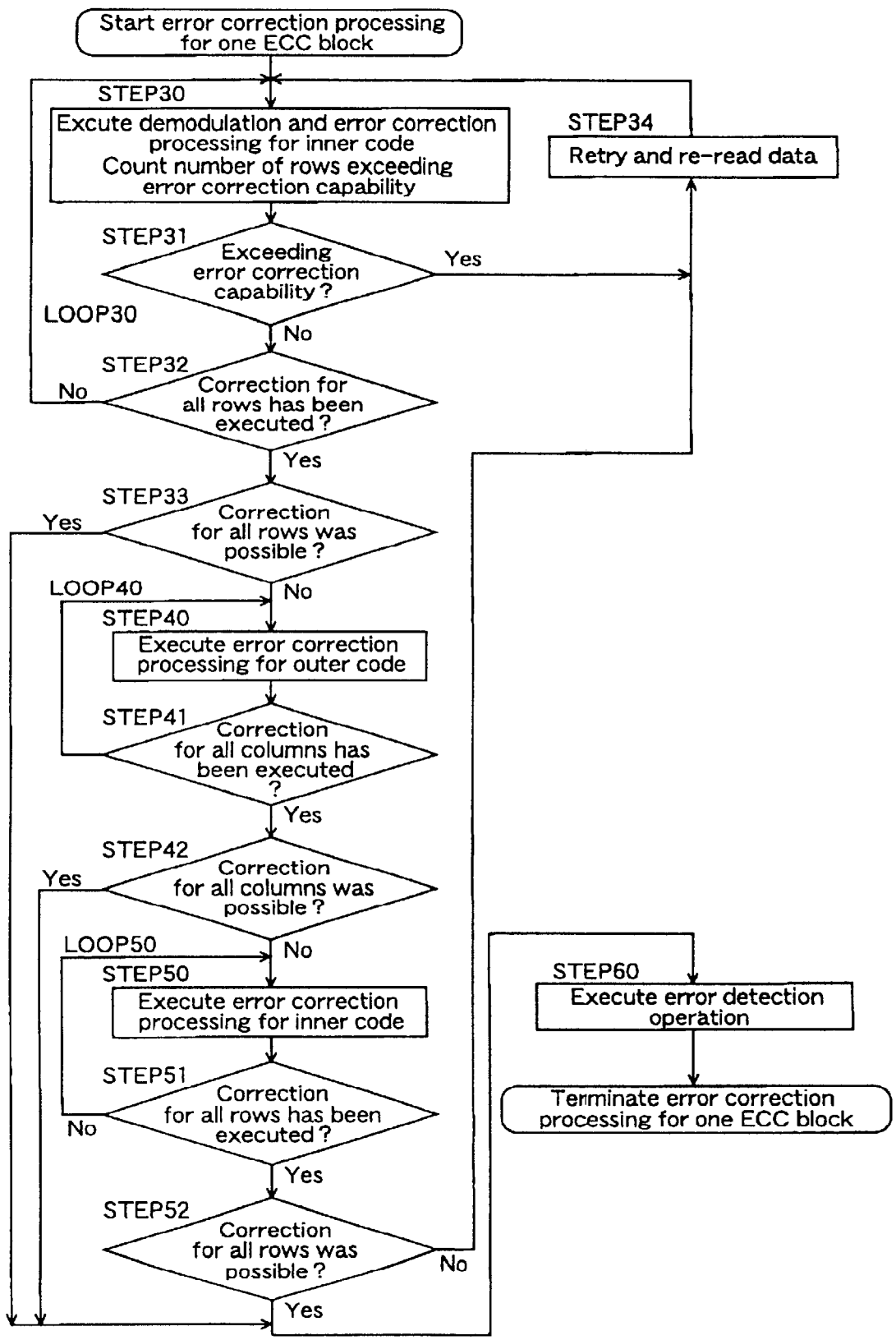
FIG. 7 is a flowchart for explaining three times error correction processing for the product code by the error correction apparatus 50a of the present invention.
Figure 8:
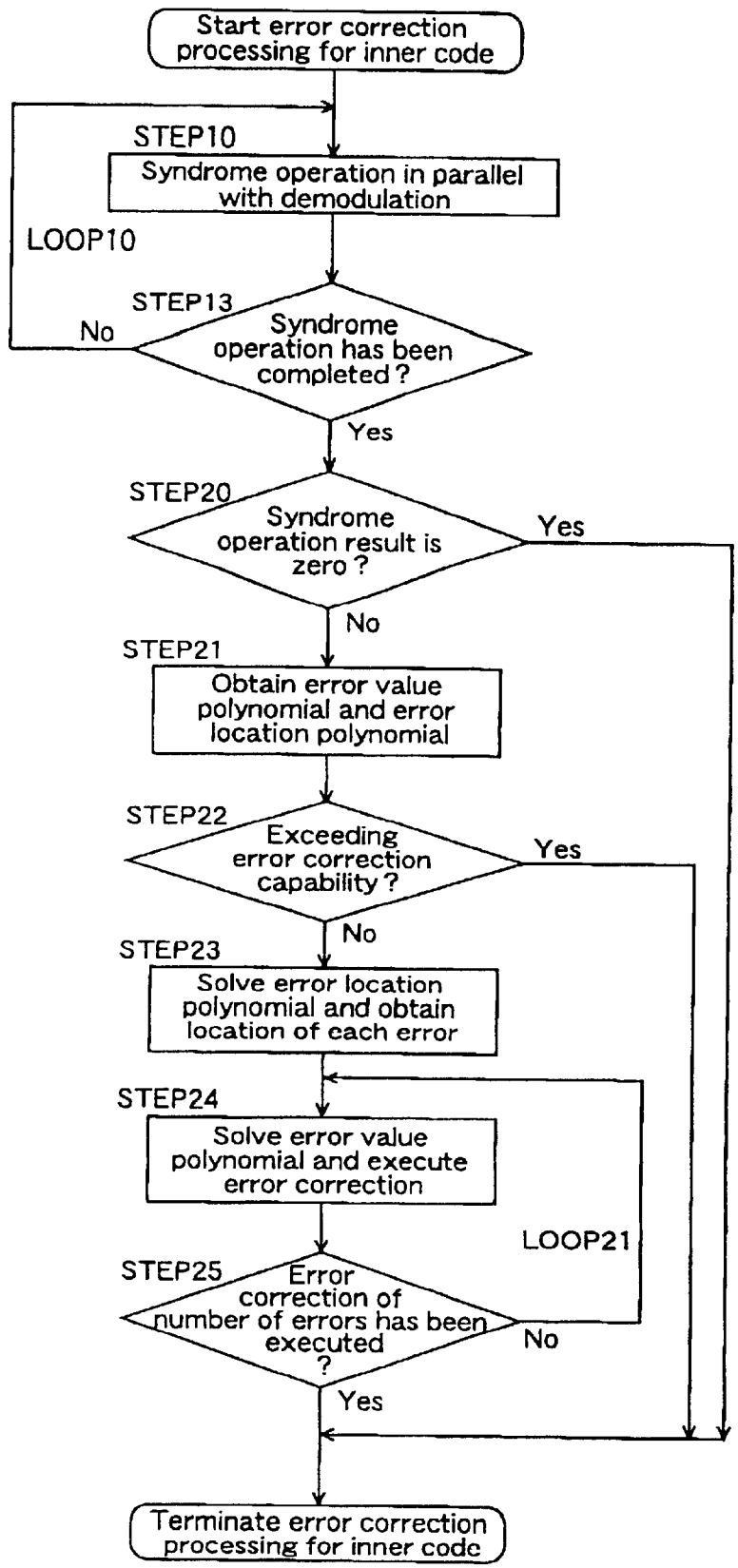
FIG. 8 is a flowchart for explaining the error correction processing for the DVD inner code by the prior art error correction apparatus 50.
Figure 9:
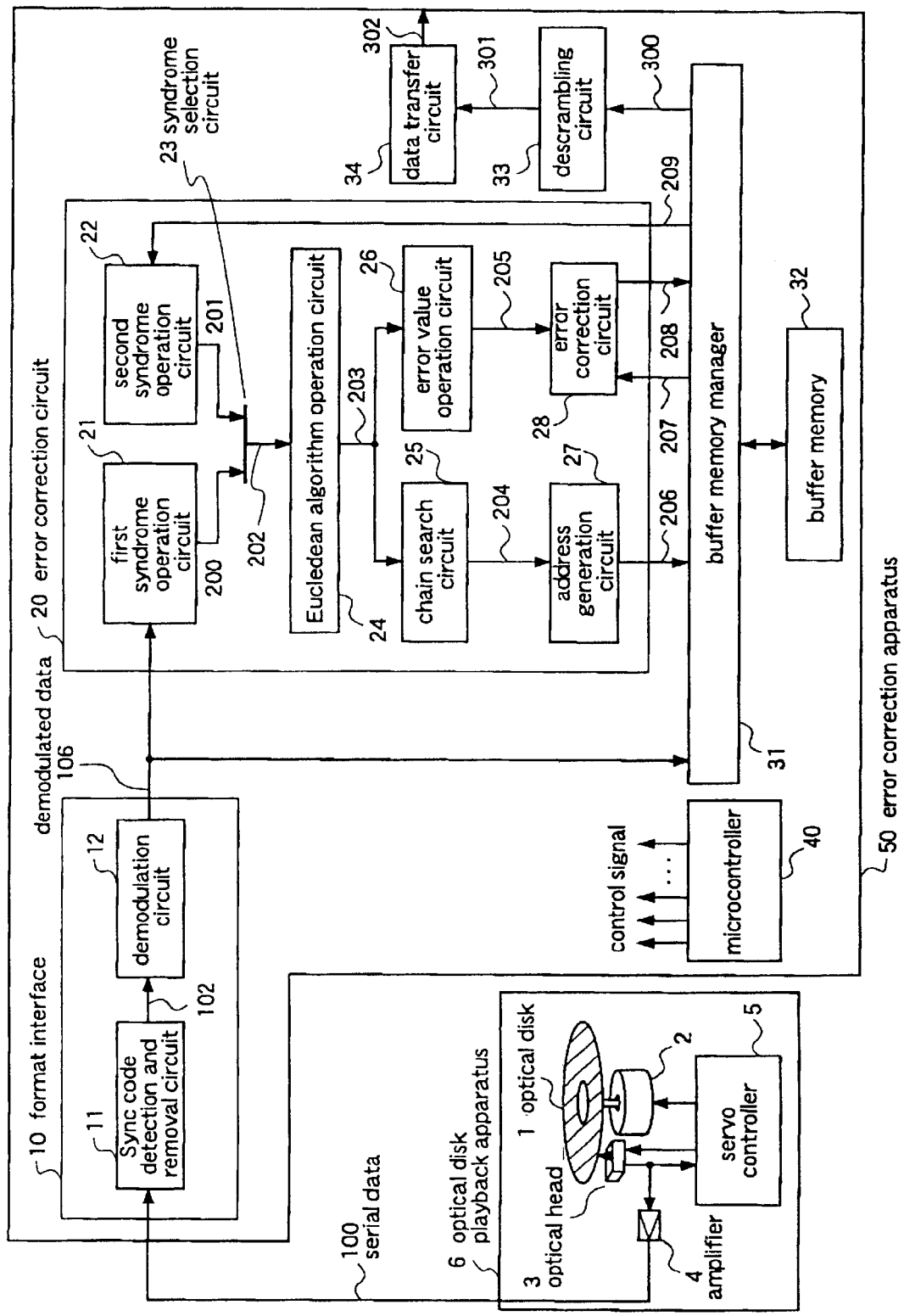
FIG. 9 is a block diagram illustrating a structure of the prior art error correction apparatus 50.

In a second embodiment, an error correction method is described with reference to a diagram of FIG. 6 illustrating a data structure of one ECC block before interleave of DVD (or after deinterleave) and a flowchart of FIG. 7 showing product code error correction.

The flowchart of FIG. 7 shows the case where the correction is executed three times in a product code, i.e., inner code→outer code→inner code.

In addition, diagonally shaded areas in FIG. 6 show inhibition patterns which can be detected at the demodulation or decoding of the inner code and SYNC frames including errors which are incapable of correction with the inner code.

As erasure correction information of the outer code which can be obtained at the demodulation time, there is information on the basis of inhibition pattern and information on the basis of data missing. That information is stored in the erasure correction information storage circuit 16 when each row is incapable of error correction. As erasure correction information of the outer code which can be obtained at the decoding of the inner code, information of rows is stored in the special area in the buffer memory 32 when the degree of the error location polynomial exceeds the error correction capability and the error correction is incapable.

When the erasure correction information on the basis of the inhibition pattern is used, for example in the case where data B0, 0 is an inhibition pattern, the location information of 0th row and 0th column is obtained. This is stored in the erasure correction information storage circuit 16 in the format of (0, 0, 1). Here, the first number is a row number. The second number is a column number or SYNC frame number. When the third number is 0, it shows that the second number is the SYNC frame number. When the third number is 1, it shows that the second number is the column number. Here, when the second number shows the SYNC frame number, 0 shows the first SYNC frame in that row, i.e., a range from the 0th column to the 90th column, 1 shows the second SYNC frame, i.e., a range from the 91st column to the 181st column, and 2 shows both of thie first and second SYNC frames, i.e., a range from the 0th column to the 181st column.

In addition, when the erasure correction information on the basis of the data missing is used, the information as to whether the data interpolation exceeding the error correction capability is executed to the first or second SYNC frame, or both of the frames in any one row is obtained. For example, when the data interpolation of 6 bytes or more is executed in each of the first and second SYNC frames in the first row, the information of the row and the SYNC frame: (1, 0, 0) and (1, 1, 0) is obtained. When the data interpolation of 6 bytes or more in two SYNC frames is executed, the information of the row and the SYNC frame: (3, 2, 0) is obtained. For example when the 189th row is incapable of error correction, the erasure correction information (189, 2, 0) which is obtained at the decoding time and stored in the special area in the buffer memory 32 is stored in accordance with the format of the erasure correction information on the basis of the inhibition pattern and the data missing.

The erasure correction of the outer code is executed using the three kinds of erasure correction information which is obtained at the demodulation or decoding of the inner code.

Next, the error correction method of the second embodiment is described with reference to the flowchart shown in FIG. 7.

Initially in STEP 30, the demodulation for the received data is executed by the format interface 10a and the error correction processing of the inner code is executed by the error correction circuit 20a. The first erasure correction information which is obtained at the decoding time is stored in the erasure correction information storage circuit 16. In addition, the second erasure correction information which is obtained at the error correction of the inner code is stored in the special area of the buffer memory 32.

In the following STEP 31, it is judged at the error correction of the outer code by the erasure correction information storage circuit 16 whether the outer code is capable of error correction, using the first erasure correction information. For example, in the case of the outer code of DVD, 8-byte error correction and 16-byte erasure correction is possible. However, when the rows in the inner codes, which are incapable of error correction, are more than 16 rows, the erasure correction cannot be executed either. Thus in STEP 31, when the uncorrectable rows in the inner codes exceeds 16 rows, the processing branches to STEP 34 to execute the re-reading of data.

The judgement as to whether the uncorrectable rows in the inner code exceeds 16 rows is made by the erasure correction information storage circuit 16, using the first erasure correction information which is stored in the erasure correction information storage circuit 16 in a following manner.

When the erasure correction of the 0th row is executed according to the inhibition patterns, whether there is information, the third number of which is 1, i.e., the second number shows the column number and the column number is "0" is searched. For example, the information (0, 0, 1) corresponds to this.

According to the data missing, whether there is information, the third number of which is "0", i.e., the second number shows the SYNC frame number and the SYNC frame number is "0" or "2" is searched. Here, the second number "0" shows that data interpolation exceeding the error correction capability of the inner code has been executed in the range from the 0th column to the 90th column and "2" shows that data interpolation has been executed in the range from the 0th column to the 181st column. For example, information (1, 0, 0) and (3, 2, 0) correspond to this.

When the similar search is conducted also for the second erasure correction information obtained at the decoding of the inner code, which is stored in the buffer memory 32, information (189, 2, 0) corresponds to this, for example. In the example shown in FIG. 6, the uncorrectable rows obtained from the three kinds of erasure correction information which is obtained at the demodulation or the decoding of the inner code are all exclusive. However, when there are overlapping rows, the judgement should be made eliminating the overlapping rows. In this case, the rows which are incapable of error correction are four and therefore the erasure correction can be executed without problem.

When the rows incapable of error correction in the inner code are less than 16 rows, the erasure correction of the outer code can be executed using the information for the erasure correction. Thus, the processing proceeds to STEP 32 and the error correction of the inner code is continued.

In STEP 32, whether the error correction of all rows (inner codes) has been executed is judged. When the error correction of all the rows is in the middle, the processing branches to LOOP 30 and the error correction of the inner codes is continued. When the error correction of all the rows has been completed, the processing proceeds to STEP 33.

In STEP 33, whether there are any rows which are incapable of error correction is judged. When there is no row which is incapable of error correction, it is decided that all errors are corrected and the processing proceeds to STEP 60. Then, the error detection as the examination as to whether there is erroneous correction in the data which were already subjected to the error correction is executed. When there is an uncorrectable row, the error correction should be executed with the outer codes. Then, the processing proceeds to STEP 40.

In STEP 40, the error correction processing with the outer codes including the erasure correction with the outer codes using the erasure correction information is executed. As for the erasure correction information, the range for detecting the data missing (in the SYNC frame units) in each row is narrower than the range for detecting the correction incapability at the decoding time (in the inner code units). Further, the range for detecting the inhibition pattern (in byte units) is narrower than the range for detecting the data missing. Therefore, the precision in the estimation of the error location, from higher to lower, is the inhibition pattern (in byte units), data missing (in SYNC frame units), and the correction incapability at the decoding time (in inner code units). That is, when one of the erasure correction information is selected on the basis of the optimum correction strategy, the error correction capability can be increased.

In the next STEP 41, whether the error correction of all the columns (outer codes.) is executed is judged. When the error correction of all the columns, is in the middle, the processing proceeds to LOOP 40 and the error correction of the outer codes is continued. When the error correction of all the columns is completed, the processing proceeds to STEP 42.

In STEP 42, whether there are any columns which are incapable or error correction is judged. When there is no uncorrectable column, it is decided that all the errors are corrected, then the processing proceeds to STEP 60, and the error detection is executed. When there is any uncorrectable column, the error correction should be executed again with the inner codes. Therefore, the processing proceeds to STEP 50 and the error correction processing with the inner codes is executed again.

In STEP 51, whether the error correction of all the rows is executed is judged. When any row which is to be subjected to the error correction remains, the processing branches to LOOP 50 and the error correction of the inner code is continued. When the error correction of all the rows is completed, the processing proceed to STEP 52.

In STEP 52, whether there are rows which were incapable of error correction is judged. When there is no row which was incapable of error correction, it is decided that all the errors are corrected, then the processing proceeds to STEP 60, and the error detection is executed. At this time, when there is any row which was incapable of error correction and the error correction cannot be completed even by the three-time correction, the processing branches to STEP 34 to re-read data. The error correction of one ECC block is terminated at the error detection in STEP 60.

As described above, according to the error correction method of the second embodiment, in the error correction of the product code, the information of data missing (in SYNC frame units) or inhibition pattern (in byte units) which is obtained at the time when the inner code is demodulated and has a narrower range and a higher precision than in the case of the conventional information of uncorrectable rows (in inner code units) which is obtained at the time when the inner code is demodulated is utilized for the erasure correction of the outer code, thereby increasing the error correction capability.

What is claimed is:

1. An error correction apparatus comprising:
    a format interface operable to demodulate information data, having error-correcting codes included therein, to output demodulated data and to detect an uncorrectable error in the information data while demodulating the information data; and
    an error correction circuit operable to decode error correction, including syndrome operation, of the demodulated data and to suspend the syndrome operation when the uncorrectable error is detected by said format interface,
    wherein the information data comprises a product code having inner codes in a row direction and outer codes in a column direction,
    wherein said error correction is operable to decode error correction for the demodulated data from said format interface in the same order as that of the demodulation of said format interface, and
    wherein said format interface comprises:
        Sync code detection and removal circuit operable to receive the information data and concurrently convert the received data, detect a frame Sync code, synchronize the received data, subsequently remove the frame Sync code and count a number of the received data in one SYNC frame;
        demodulation circuit operable to demodulate the received data from said Sync code detection and removal circuit;
        a number-of-missing-data counter operable to count a number of missing data in a predetermined code length of data on the basis of the number of the received data from said Sync code detection and removal circuit;
        an inhibition pattern detector/counter operable to detect abnormal patterns which do not conform a predetermined modulation rule from the received data which are output from said Sync code detection and removal circuit, and to count a number of inhibition patterns; and
        error correction incapability judge/control circuit operable to judge whether an uncorrectable error is included in the information data on the basis of the number of missing data obtained by said number-of-missing-data counter and the number of inhibition patterns obtained by said inhibition pattern detector/counter, and to output an error correction incapability detection signal when the uncorrectable error is included.

2. The error correction apparatus of claim 1 wherein, when there is data missing in the information data, said demodulation circuit is operable to interpolate the missing data on the basis of the number of the missing data obtained by said number-of-missing-data counter, and to make the information have the predetermined code length.

3. The error correction apparatus of claim 1, wherein, when there is data missing in the information data, said Sync code detection and removal circuit is operable to interpolate the missing data using the inhibition patterns under the modulation rule,
    wherein said inhibition pattern detector/counter is operable to detect the inhibition patterns in the information data for which the missing data is interpolated by said Sync code detection and removal circuit, and
    wherein said correction incapability judge/control circuit is operable to judge whether the error correction is possible, only on the basis of whether the number of inhibition patterns obtained by said inhibition pattern detector/counter exceeds an error correction capability of the information data.

4. The error correction apparatus of claim 1, further comprising:
    an erasure correction information storage circuit, which when said error correction incapability judge/control circuit judges that an uncorrectable error is included in the information data in the same direction as that of the demodulation, stores location information of correction incapability of the error judged to be uncorrectable as first erasure correction information,
    wherein when the information is decoded in a direction different from that of a direction of the code demodulation, the erasure correction information storage means judges whether erasure correction is possible from whether the number of error correction incapabilities in the information data in the same direction as that of the direction of the code demodulation, as the number of erasures, exceeds erasure correction capability of the information data in the direction different from that of the direction of the code demodulation, on the basis of the first erasure correction information which is stored in the means when the information data are decoded in a direction different from that of the direction of the code demodulation, and controls the execution of the erasure correction on the basis of the judgement result.

5. An error correction apparatus comprising:
    a format interface operable to demodulate information data, having error-correcting codes included therein, to output demodulated data and to detect an uncorrectable error in the information data while demodulating the information data; and
    an error correction circuit operable to decode error correction, including syndrome operation, of the demodulated data and to suspend the syndrome operation when the uncorrectable error is detected by said format interface,
    wherein the information data demodulation means comprises:
        Sync code detection and removal circuit operable to receive the information data and concurrently convert the received data, detect a frame Sync code, synchronize the received data, subsequently remove the frame Sync code and count a number of the received data in one SYNC frame;
        demodulation circuit operable to demodulate the received data from said Sync code detection and removal circuit;
        a number-of-missing-data counter operable to count a number of missing data in a predetermined code length of data on the basis of the number of the received data from said Sync code detection and removal circuit;

an inhibition pattern detector/counter operable to detect abnormal patterns which do not conform a predetermined modulation rule from the received data which are output from said Sync code detection and removal circuit, and to count a number of inhibition patterns; and error correction incapability judge/control circuit operable to judge whether an uncorrectable error is included in the information data on the basis of the number of missing data obtained by said number-of-missing-data counter and the number of inhibition patterns obtained by said inhibition pattern detector/counter, and to output an error correction incapability detection signal when the uncorrectable error is included.

6. The error correction apparatus of claim 5 wherein, when there is data missing in the information data, said demodulation circuit is operable to interpolate the missing data on the basis of the number of the missing data obtained by said number-of-missing-data counter, and to make the information have the predetermined code length.

7. The error correction apparatus of claim 5 wherein, when there is data missing in the information data, said Sync code detection and removal circuit is operable to interpolate the missing data using the inhibition patterns under the modulation rule, wherein said inhibition pattern detector/counter is operable to detect the inhibition patterns in the information data for which the missing data is interpolated by said Sync code detection and removal circuit, and wherein said correction incapability judge/control circuit is operable to judge whether the error correction is possible, only on the basis of whether the number of inhibition patterns obtained by said inhibition pattern detector/counter exceeds an error correction capability of the information data.

8. The error correction apparatus of claim 5 wherein an erasure correction information storage circuit, when said error correction incapability judge/control circuit judges that an uncorrectable error is included in the information data in the same direction as that of a demodulation code direction, stores location information of correction incapability of the error judged to be uncorrectable as first erasure correction information, wherein when the information is decoded in a direction different from that of a direction of the code demodulation, the erasure correction information storage means judges whether erasure correction is possible from whether the number of error correction incapabilities in the information data in the same direction as that of the direction of the code demodulation, as the number of erasures, exceeds erasure correction capability of the information data in the direction different from that of the direction of the code demodulation, on the basis of the first erasure correction information which is stored in the means when the information data are decoded in a direction different from that of the direction of the code demodulation, and controls the execution of the erasure correction on the basis of the judgement result.

9. The error correction apparatus of claim 8, wherein said storage is further operable to store the location information of the error correction incapability, obtained when the error location is detected by said error detection circuit, as second erasure correction information, and wherein said error correction circuit is operable to select optimum erasure correction information from first erasure correction information which is stored in the erasure correction information storage means and second erasure correction information which is stored in the storage means when the erasure correction of the information data in the direction different from that of a direction of the code demodulation is possible, and uses the selected erasure correction information for the erasure correction.

10. The error correction apparatus of one of claim 5, further comprising:

storage operable to store the demodulated data, wherein said error correction circuit comprises a first syndrome operation circuit, a second syndrome operation circuit, a syndrome selection circuit, an error detection circuit and a correction circuit, wherein said first syndrome operation circuit is operable to execute a syndrome operation for the demodulated data output from said format interface, wherein said second syndrome operation circuit is operable to execute a syndrome operation for the demodulated data output from the storage, wherein said syndrome selection circuit is operable to select one of syndrome operation results of said first and said second syndrome operation circuits and to output the selected syndrome operation result, wherein said error detection circuit is operable to calculate an error location and an error value on the basis of the syndrome operation result output from the syndrome selection circuit, and wherein said correction circuit is operable to correct errors in the received information data on the basis of the error location and the error value.

11. The error correction apparatus of claim 10, wherein said storage is further operable to store the location information of the error correction incapability, obtained when the error location is detected by said error detection circuit, as second erasure correction information, and wherein said error correction circuit is operable to select optimum erasure correction information from first erasure correction information which is stored in the erasure correction information storage means and second erasure correction information which is stored in the storage means when the erasure correction of the information data in the direction different from that of a direction of the code demodulation is possible, and uses the selected erasure correction information for the erasure correction.

12. The error correction apparatus of claim 10, wherein said first syndrome operation circuit is operable to suspend the syndrome operation as well as to nullify the syndrome operation result, when an error correction incapability detection signal is input by the error correction incapability judge/control circuit during the syndrome operation, and wherein said error detection circuit is not operable to calculate the error location and the error value when the syndrome operation result is zero.

13. The error correction apparatus of claim 10, further comprising a controller operable to execute none or part of a series of the operations of the syndrome operation, the calculation of the error location and the error value and the error correction when the error correction incapability detection signal is input to said correction circuit by the error correction incapability judge means.

14. An error correction apparatus comprising:

information data demodulation means for executing demodulation processing of information data, having error-correcting codes included therein, to output demodulated data and for detecting an uncorrectable error in information data in parallel with the demodulation processing; and correction decoding means for executing decoding of error correction, including syndrome operation, of the demodulated data and for suspending the syndrome operation when the uncorrectable error is detected by said information data demodulation means, wherein the information data comprises a product code having inner codes in a row direction and outer codes in a column direction, wherein said correction decoding means is operable to decode error correction for the demodulated data from the information data demodulation means in the same order as that of the demodulation in said information data demodulation means, and wherein the information data demodulation means comprises:

Sync code detection and removal means for receiving the information data, converting the received data in parallel, detecting a frame Sync code, synchronizing the received data, and then removing the frame Sync code, as well as counting a number of the received data in one SYNC frame;

demodulation means for executing demodulation processing for the received data from said Sync code detection and removal means;

a number-of-missing-data counter for counting a number of missing data in a predetermined code length of data on the basis of the number of the received data from said Sync code detection and removal means;

an inhibition pattern detector/counter for detecting abnormal patterns which do not conform a predetermined modulation rule from the received data which are output from said Sync code detection and removal means, and counting a number of inhibition patterns; and error correction incapability judge means for judging whether an uncorrectable error is included in the information data on the basis of the number of missing data obtained by said number-of-missing-data counter and the number of inhibition patterns obtained by said inhibition pattern detector/counter, and outputting an error correction incapability detection signal when the uncorrectable error is included.

15. The error correction apparatus of claim 14, wherein, when there is data missing in the information data, said demodulation means is operable to interpolate the missing data on the basis of the number of the missing data obtained by said number-of-missing-data counter, and to make the information have the predetermined code length.

16. The error correction apparatus of claim 14, wherein, when there is data missing in the information data, said Sync code detection and removal means is operable to interpolate the missing data using the inhibition patterns under the modulation rule, wherein said inhibition pattern detector/counter is operable to detect the inhibition patterns in the information data for which the missing data is interpolated by said Sync code detection and removal means, and wherein said error correction incapability judge means is operable to judge whether the error correction is possible, only on the basis of whether the number of inhibition patterns obtained by said inhibition pattern detector/counter exceeds an error correction capability of the information data.

17. The error correction apparatus of claim 14, further comprising:

erasure correction information storage means, which, when said error correction incapability judge means judges that an uncorrectable error is included in the information data in the same direction as that of the demodulation, stores location information of correction incapability of the error judged to be uncorrectable as first erasure correction information, wherein when the information is decoded in a direction different from that of a direction of the code demodulation, the erasure correction information storage means judges whether erasure correction is possible from whether the number of error correction incapabilities in the information data in the same direction as that of the direction of the code demodulation, as the number of erasures, exceeds erasure correction capability of the information data in the direction different from that of the direction of the code demodulation, on the basis of the first erasure correction information which is stored in the means when the information data are decoded in a direction different from that of the direction of the code demodulation, and controls the execution of the erasure correction on the basis of the judgement result.

18. An error correction apparatus comprising:

information data demodulation means for executing demodulation processing of information data, having error-correcting codes included therein, to output demodulated data and for detecting an uncorrectable error in information data in parallel with the demodulation processing; and correction decoding means for executing decoding of error correction, including syndrome operation, of the demodulated data and for suspending the syndrome operation when the uncorrectable error is detected by said information data demodulation means, wherein the information data demodulation means comprises:

Sync code detection and removal means for receiving the information data, converting the received data in parallel, detecting a frame Sync code, synchronizing the received data, and then removing the frame Sync code, as well as counting a number of the received data in one SYNC frame;

demodulation means for executing demodulation processing for the received data from said Sync code detection and removal means;

a number-of-missing-data counter for counting a number of missing data in a predetermined code length of data on the basis of the number of the received data from said Sync code detection and removal means;

an inhibition pattern detector/counter for detecting abnormal patterns which do not conform a predetermined modulation rule from the received data which are output from said Sync code detection and removal means, and counting a number of inhibition patterns; and error correction incapability judge means for judging whether an uncorrectable error is included in the information data on the basis of the number of missing data obtained by said number-of-missingdata counter and the number of inhibition patterns obtained by said inhibition pattern detector/counter, and outputting an error correction incapability detection signal when the uncorrectable error is included.

19. The error correction apparatus of claim 18, wherein, when there is data missing in the information data, said demodulation means is operable to interpolate the missing data on the basis of the number of the missing data obtained by said number-of-missing-data counter, and to make the information have the predetermined code length.

20. The error correction apparatus of claim 18, wherein, when there is data missing in the information data, said Sync code detection and removal means is operable to interpolate the missing data using the inhibition patterns under the modulation rule, wherein said inhibition pattern detector/counter is operable to detect the inhibition patterns in the information data for which the missing data is interpolated by said Sync code detection and removal means, and wherein said error correction incapability judge means is operable to judge whether the error correction is possible, only on the basis of whether the number of inhibition patterns obtained by said inhibition pattern detector/counter exceeds an error correction capability of the information data.

21. The error correction apparatus of claim 18, further comprising:

erasure correction information storage means, which, when said error correction incapability judge means judges that an uncorrectable error is included in the information data in the same direction as that of a demodulation code direction, stores location information of correction incapability of the error judged to be uncorrectable as first erasure correction information, wherein when the information is decoded in a direction different from that of a direction of the code demodulation, the erasure correction information storage means judges whether erasure correction is possible from whether the number of error correction incapabilities in the information data in the same direction as that of the direction of the code demodulation, as the number of erasures, exceeds erasure correction capability of the information data in the direction different from that of the direction of the code demodulation, on the basis of the first erasure correction information which is stored in the means when the information data are decoded in a direction different from that of the direction of the code demodulation, and controls the execution of the erasure correction on the basis of the judgement result.

22. The error correction apparatus of claim 21, wherein said storage means is further operable to store the location information of the error correction incapability, obtained when the error location is detected by said error detection means, as second erasure correction information, and wherein said correction decoding means is operable to select optimum erasure correction information from first erasure correction information which is stored in the erasure correction information storage means and second erasure correction information which is stored in the storage means when the erasure correction of the information data in the direction different from that of a direction of the code demodulation is possible, and uses the selected erasure correction information for the erasure correction.

23. The error correction apparatus of claim 18, further comprising:

storage means operable to store the demodulated data, wherein said correction decoding means comprises first syndrome operation means for executing syndrome operation for the demodulated data output from said demodulation means, second syndrome operation means for executing syndrome operation for the demodulated data output from said storage means, syndrome selection means for selecting one of syndrome operation results of said first and second syndrome operation means and outputting the selected syndrome operation result, error detection means for calculating an error location and an error value on the basis of the syndrome operation result output from said syndrome selection means, and correction means for correcting errors in the received information data on the basis of the error location and the error value.

24. The error correction apparatus of claim 23, wherein said storage means is further operable to store the location information of the error correction incapability, obtained when the error location is detected by said error detection means, as second erasure correction information, and wherein said correction decoding means is operable to select optimum erasure correction information from first erasure correction information which is stored in the erasure correction information storage means and second erasure correction information which is stored in the storage means when the erasure correction of the information data in the direction different from that of a direction of the code demodulation is possible, and uses the selected erasure correction information for the erasure correction.

25. The error correction apparatus of claim 23, wherein said first syndrome operation means is operable to suspend the syndrome operation as well as to nullify the syndrome operation result, when an error correction incapability detection signal is input by the error correction incapability judge means during the syndrome operation, and wherein said error detection means is not operable to calculate the error location and the error value when the syndrome operation result is zero.

26. The error correction apparatus of claim 23, further comprising control means for controlling, so as to execute none or part of a series of operations of the syndrome operation, the calculation of the error location and the error value, and the error correction in said correction means, when the error correction incapability detection signal is input to said correction means by the error correction incapability judge means.

27. An error correction method comprising:

when demodulation processing is executed for information data to which error correcting-codes are added, detecting whether there are inhibition patterns which do not conform a modulation rule of the information data and there is data missing in a SYNC frame and counting a number of the inhibition patterns and the missing data, respectively;

detecting errors which are incapable of error correction from the information data on the basis of the number of the missing data and the number of the inhibition patterns and judging whether the detected errors are capable of the error correction;

executing error correction processing when the judgement result of the error correction indicates that the error correction is capable;

terminating the series of the error correction processing, when the judgement result of the error correction indicates that the error correction is incapable or when the error correction is completed; and judging whether error correction of the information data is possible prior to the error correction processing, and controlling the error correction processing on the basis of the judgement result.

28. The error correction method of claim 27, further comprising:

storing location information of error correction incapability as first erasure correction information when it is judged that errors included in the information data are incapable of the error correction;

storing location information of error correction incapability, which is obtained during the error correction, as second erasure correction information; and executing erasure correction of the information data in a direction different from that of a demodulation code direction, using the stored first and second erasure correction information.

* * * * *